United States Patent
Ho et al.

(10) Patent No.: US 9,431,908 B2
(45) Date of Patent: Aug. 30, 2016

(54) ZERO CURRENT DETECTOR AND DC-DC CONVERTER USING SAME

(71) Applicant: Fitipower Integrated Technology, Inc., Hsinchu (TW)

(72) Inventors: Chio-Yi Ho, Hsinchu (TW); Wen-Yen Lee, Hsinchu (TW); Yi-Sheng Liu, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 67 days.

(21) Appl. No.: 14/493,791

(22) Filed: Sep. 23, 2014

(65) Prior Publication Data

US 2015/0084605 A1 Mar. 26, 2015

(30) Foreign Application Priority Data

Sep. 26, 2013 (TW) .................................. 102134776

(51) Int. Cl.
| | | |
|---|---|---|
| *G05F 1/00* | (2006.01) | |
| *H02M 3/158* | (2006.01) | |
| *G01R 19/175* | (2006.01) | |
| *H02M 1/00* | (2006.01) | |

(52) U.S. Cl.
CPC .......... *H02M 3/1588* (2013.01); *G01R 19/175* (2013.01); *H02M 2001/0009* (2013.01); *Y02B 70/1466* (2013.01)

(58) Field of Classification Search
CPC .. H02M 3/156; H02M 3/1588; H02M 3/157; H02M 1/083
USPC .......................... 323/222, 235, 271, 282–285
See application file for complete search history.

(56) References Cited

U.S. PATENT DOCUMENTS

| | | | |
|---|---|---|---|
| 6,507,175 B2* | 1/2003 | Susak ................. | G01R 19/175 323/235 |
| 2010/0039735 A1* | 2/2010 | Trescases ............ | H02M 3/1588 361/18 |
| 2014/0160601 A1* | 6/2014 | Ouyang ................ | H02M 3/158 361/18 |

* cited by examiner

*Primary Examiner* — Nguyen Tran
(74) *Attorney, Agent, or Firm* — Zhigang Ma

(57) ABSTRACT

A DC-DC converter includes a zero current detector. The DC-DC converter includes a high-side switch and a low-side switch. When the DC-DC converter works in a discontinuous conduction mode (DCM). The zero current detector detects a zero current a detection node which is arranged between the high-side switch and the low-side switch generates the zero current, the zero current detector outputs the control signal to a driver. The driver switches the high-side switch and the low-side switch off simultaneously according to the control signal.

14 Claims, 3 Drawing Sheets

ZERO CURRENT DETECTOR AND DC-DC CONVERTER USING SAME

CROSS-REFERENCE TO RELATED APPLICATIONS

This application claims priority to Taiwanese Patent Application No. 102134776 filed on Sep. 26, 2013, the contents of which are incorporated by reference herein.

FIELD

The disclosure generally relates to a zero current detector and a DC-DC converter having the zero current detector.

BACKGROUND

A DC-DC converter supplies power for a microprocessor or a memory. When the DC-DC converter works in a discontinuous conduction mode (DCM), an inductor generates a reverse current. The reverse current makes additional power consumption.

BRIEF DESCRIPTION OF THE DRAWINGS

Implementations of the present technology will now be described, by way of example only, with reference to the attached figures.

DETAILED DESCRIPTION

Figure 1:
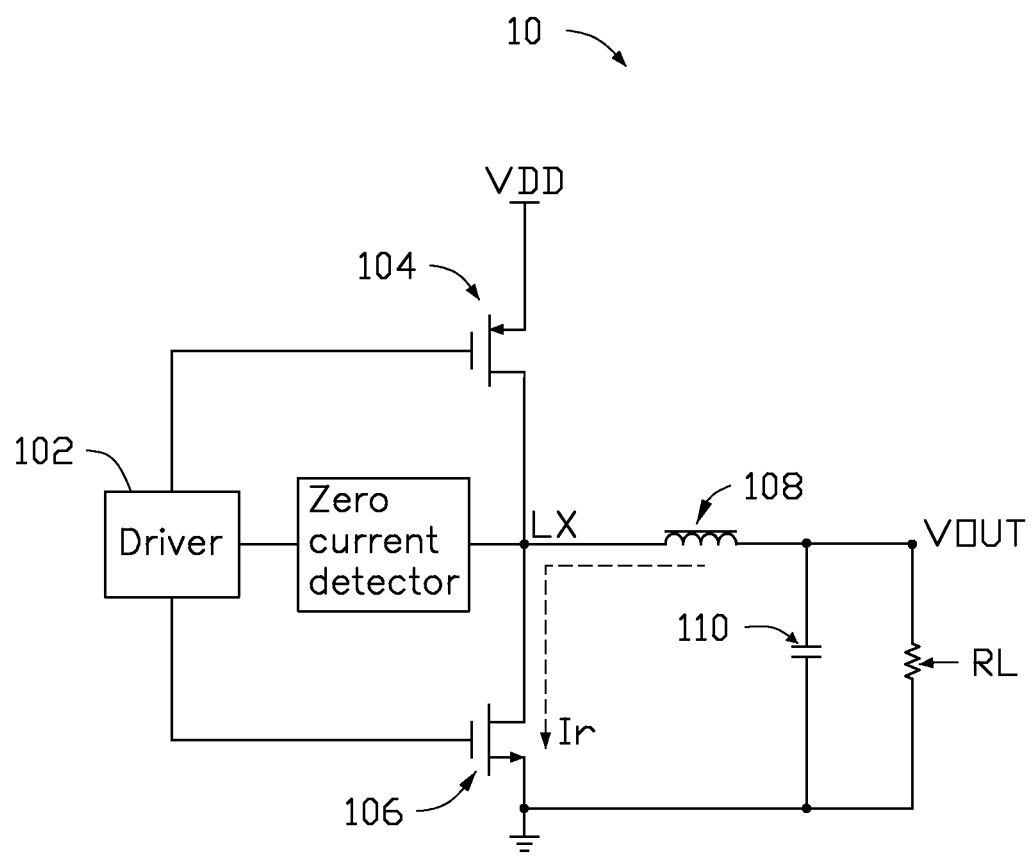
FIG. 1 is a block diagram of a DC-DC converter having a zero current detector according to one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected.

FIG. 1 shows a block diagram of a DC-DC converter 10 according to one embodiment. The DC-DC converter 10 can include a driver 102, a high-side switch 104, a low-side switch 106, an inductor 108, a capacitor 110, a load RL, and a power output terminal VOUT. The driver 102 can switch the high-side switch 104 and the low-side switch 106 on or off. In one embodiment, the high-side switch 104 is a P-metal oxide semiconductor (PMOS) transistor; the low-side switch 106 is an N-metal oxide semiconductor (NMOS) transistor. A source of the high-side switch 104 is coupled to a voltage source VDD. A drain of the high-side switch 104 is coupled to a drain of the low-side switch 106. A source of the low-side switch 106 is grounded. A gate of the high-side switch 104 and a gate of the low-side switch 106 are coupled to the driver 102. A node between the drain of the high-side switch 104 and the drain of the low-side switch 106 is a detection node LX. The detection node LX is coupled to the load RL via the inductor 108 and the power output terminal VOUT. The inductor 108 is grounded via the capacitor 110. The DC-DC converter 10 can further include a zero current detector 120 coupled between the detection node LX and the driver 102.

When the DC-DC converter 10 works in a discontinuous conduction mode (DCM), the zero current detector 120 detects a zero current of the detection node LX. In other words, the zero current detector 120 detects a reverse current Ir (as shown in FIG. 1), when the high-side switch 104 is turned off and the low-side switch 106 is turned on. When the zero current generates, the zero current detector 120 outputs an indicating signal to the driver 102 to switch the low-side switch 106 off.

Figure 2:
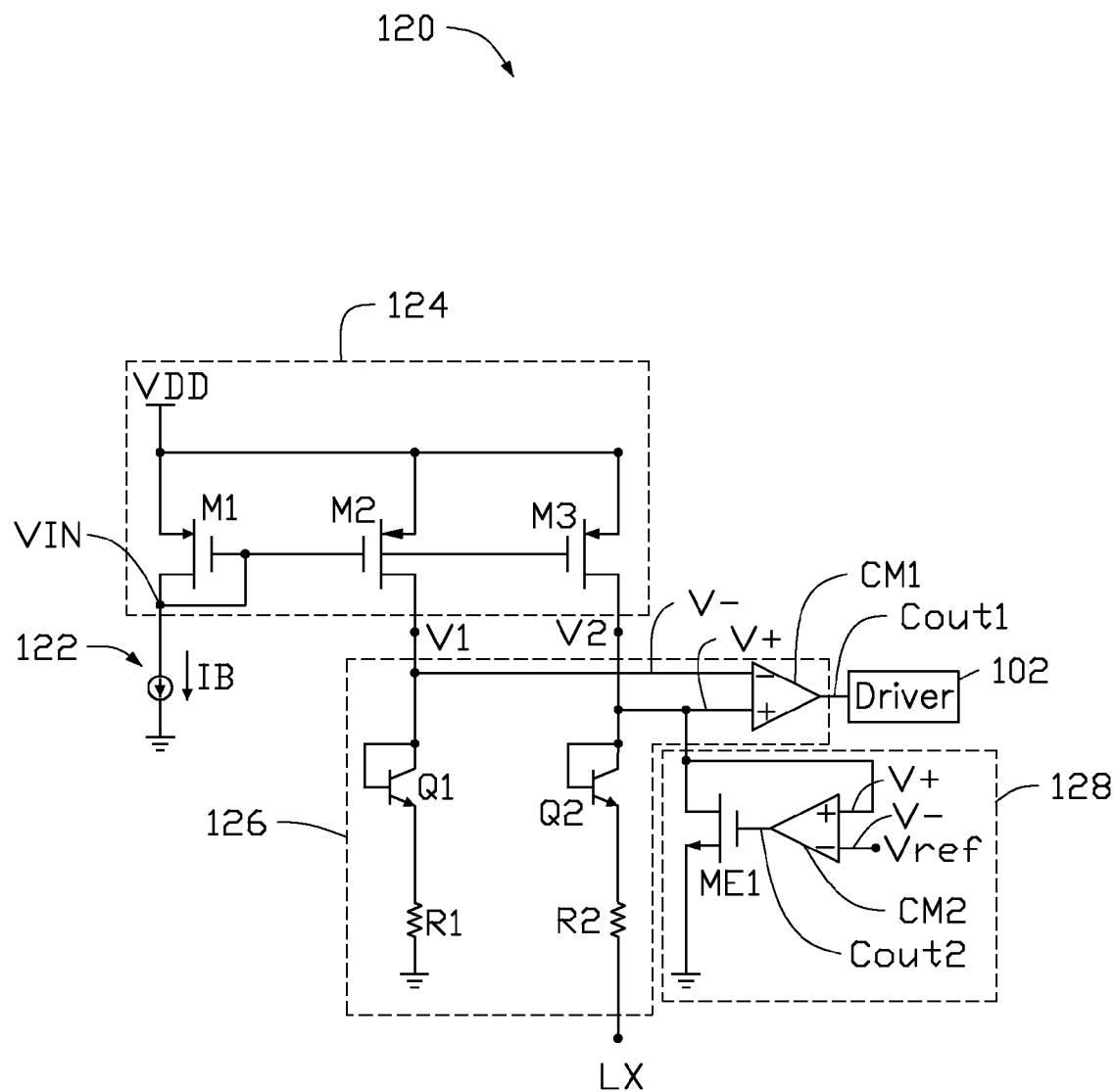
FIG. 2 is a diagrammatic view of the zero current detector of FIG. 1.

FIG. 2 shows a schematic diagram of the zero current detector 120. The zero current detector 120 can include a bias current source 122, a current mirror 124, a zero current detection unit 126, and a voltage control unit 128. The current mirror 124 can include an input terminal VIN, a first PMOS transistor M1, a second PMOS transistor M2, a third PMOS transistor M3, a first output terminal V1, and a second output terminal V2. The bias current 122 is coupled to the input terminal VIN and supplies a direct bias current IB to the input terminal VIN. The gates of the first, second, and third PMOS transistor M1, M2, and M3 are coupled to the input terminal VIN. A drain of the first PMOS transistor M1 is coupled to the input terminal VIN. The sources of the first, second, and third PMOS transistor M1, M2, and M3 are coupled to the voltage source VDD. The drain of the second PMOS transistor M2 is the first output terminal V1, the drain of the third PMOS transistor M3 is the second output terminal V2. As the function of the current mirror 124, the current of the first and second output terminal V1 and V2 is also IB. A voltage of the detection node LX is denoted as VLX.

The zero current detection unit 126 can include a first transistor Q1, a second transistor Q2, a first resistor R1, a second resistor R2, and a first comparator CM1. The first output terminal V1 is grounded via the first transistor Q1 and the first resistor R1. The second transistor Q2 and the second resistor R2 are coupled between the output terminal V2 and the detection node LX in series. The first comparator CM1 can include an inverting input terminal V−, a non-inverting input terminal V+, and a first comparison output terminal Cout 1. The inverting input terminal V− is coupled to the first output terminal V1, the non-inverting input terminal V+ is coupled to the second output terminal V2, and the first comparison output terminal Cout1 is coupled with the driver 102.

In the one embodiment, the first and second transistors Q1 and Q2 are NPN bipolar transistors which can be configured in diode-connected fashion. The first comparator CM1 has a high speed and low input offset. A base and a collector of the first transistor Q1 are coupled to the first output terminal V1, and an emitter of the first transistor Q1 is grounded via the first resistor R1. A base and a collector of the second transistor Q2 are coupled to the second output terminal V2, and an emitter of the second transistor Q2 is coupled to the detection node LX via the second resistor R2. In one embodiment, the first and second transistors Q1 and Q2 are diodes, and anodes of the diodes are respectively coupled to the first and second output terminals V1 and V2, cathodes of the diodes are coupled to the first and second resistors R1 and R2.

A voltage level of the inverting input terminal V− is $IB*R1_0+VBE_{Q1}$, wherein $R1_0$ denotes a resistance of the first resistor R1, $VBE_{Q1}$ denotes a forward conductive voltage of the first transistor Q1. A voltage level of the non-inverting input terminal V+ is $IB*R2_0+VBE_{Q2}+VLX$, wherein $R2_0$ denotes a resistance of the second resistor R2, $VBE_{Q2}$ denotes a forward conductive voltage of the second transistor Q2.

The voltage controlling unit 128 can include a first NMOS transistor ME1 and a second comparator CM2. A drain of the first NMOS transistor ME1 is coupled to the second output terminal V2 and a source of the first NMOS transistor ME1 is grounded. The second comparator CM2 can include a non-inverting input terminal V+, an inverting input terminal V−, and a second comparison output terminal Cout2. The non-inverting input terminal V+ of the second comparator CM2 is coupled to the second output terminal V2. The inverting input terminal V− of the second comparator CM2 is coupled to a reference voltage Vref. The second comparison output terminal Cout2 is coupled to a gate of the first NMOS transistor ME1.

Figure 3:
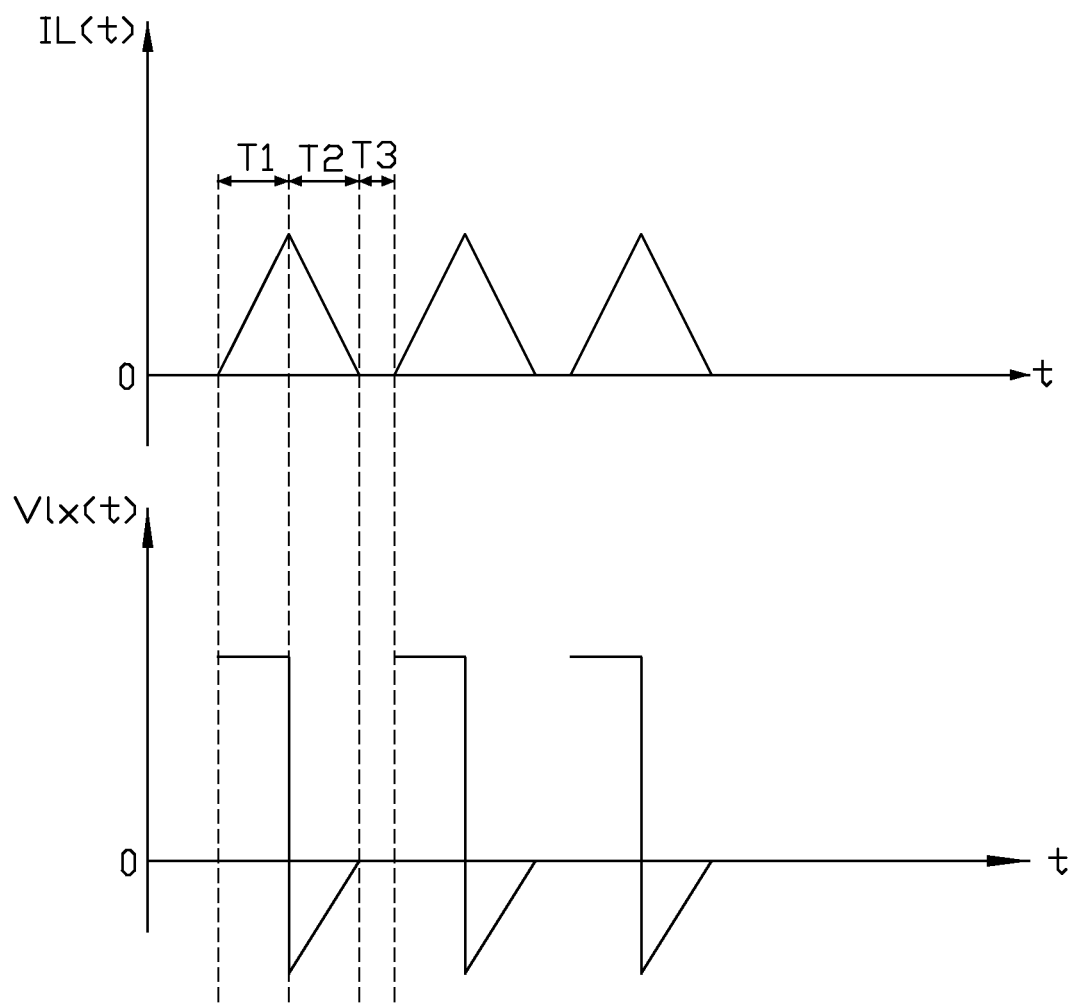
FIG. 3 is a graph showing an inductor current and a voltage of a detection node when the DC-DC converter of FIG. 1 is in discontinuous conduction mode (DCM)

FIG. 3 illustrates a graph of an inductor current IL and a voltage of a detection node VLX when the DC-DC converter of FIG. 1 is in discontinuous conduction mode (DCM) which is light load. During a first period T1, the driver 102 switches the high-side switch 104 on and the low-side switch 10 off. The inductor 108 is charged and power is supplied to the load RL via the power output terminal VOUT. The voltage VLX of the detection node LX is positive. The voltage level of the inverting input terminal V− of the first comparator CM1 is lower than the voltage level of the non-inverting input terminal V+ of the first comparator CM1, the first comparison output terminal Cout1 outputs a first control signal to the driver 102. The driver 102 switches the high-side switch 104 on and the low-side switch 106 off under control of the first control signal. The zero current detector 120 does not work.

During a second period T2, the driver 102 switches the high-side switch 104 off and the low-side switch 106 on, the inductor 108 discharges and power is supplied to the load RL via the power output terminal VOUT. The voltage VLX of the detection node LX is negative. The voltage level of the inverting input terminal V− of the first comparator CM1 is larger than the voltage level of the non-inverting input terminal V+ of the first comparator CM1, the first comparison output terminal Cout1 outputs a second control signal to the driver 102. The driver 102 switches the high-side switch 104 on and the low-side switch 106 off under control of the second control signal.

During a period T3, the detection node LX generates the zero current and the voltage VLX of the detection node LX is zero simultaneously, the voltage level of the non-inverting input terminal V+ of the first comparator CM1 is larger than the voltage level of the inverting input terminal V− of the first comparator CM1, the first comparison output terminal Cout1 outputs a third control signal to the driver 102. The driver 102 switches the high-side switch 104 and the low-side switch 106 off simultaneously to suppress the reverse current Ir. Thus, a conversion efficiency of the DC-DC converter 10 is improved.

In the embodiment, a detection value of the reverse current is changed by changing resistance of the first resistor R1 and the second resistor R2. The first resistor R1 and the second resistor R2 are high-resistance value resistors, when electrostatic discharge applies in the detection node LX, the first resistor R1 and the second resistor R2 protect the zero current detector 102 from the electrostatic discharge.

When the DC-DC converter 10 switches to DCM from continuous conduction mode (CCM) which is heavy load mode, the voltage of the detection node LX increases, the voltage level of the non-inverting input terminal V+ of the first comparator CM1 increases.

When the voltage level of the non-inverting input terminal V+ of the first comparator CM1 is larger than the reference voltage Vref, the second comparison output terminal Cout2 outputs a control signal to turn on the first NMOS transistor ME1. The first NMOS transistor ME1 clamps the voltage level of the non-inverting input terminal V+ with the reference voltage Vref. The voltage of the non-inverting input terminal V+ is limited in a predetermined range by adjusting the reference voltage. The voltage difference between the voltage of the non-inverting input terminal V+ of the first comparator CM1 and the voltage of the inverting input terminal V− of the first comparator CM1 is controlled within a predetermined range to increase the responsivity of the first comparator CM1. In the embodiment, the control signal is a logic high signal.

When the DC-DC converter 10 works in CCM, the voltage of the non-inverting input terminal V+ is remained by adjusting the reference voltage Vref, thus the DC-DC converter 10 can work normally.

In summary, the DC-DC converter 10 includes the zero current detector 120 to detect the zero current of the reverse current, and when the detection node LX generates the zero current, the zero current detector outputs the control signal to the driver. The driver 102 switches the high-side switch 104 and the low-side switch 106 off simultaneously according to the control signal to improve conversion efficiency of the DC-DC converter. Further, when the DC-DC converter 10 switches to DCM from continuous conduction mode (CCM) which is heavy load mode, the responsivity of the first comparator CM1 is improved by adjusting the reference voltage to limit the voltage of the non-inverting input terminal V+ in the predetermined range.

It is to be understood that even though numerous characteristics and advantages of the present embodiments have been set forth in the foregoing description, with details of the structures and functions of the embodiments, the disclosure is illustrative only and changes may be in detail, especially in the matter of arrangement of parts within the principles of the embodiments, to the full extent indicated by the broad general meaning of the terms in which the appended claims are expressed.

What is claimed is:

1. A zero current detector comprising:
   a bias current source;
   a current mirror comprising: an input terminal coupled to the bias current source, a first output terminal, and a second output terminal;
   a first transistor coupled to the first output terminal and grounded via a first resistor;
   a second transistor coupled to the second output terminal and a detection node via a second resistor;
   a first comparator comprising a non-inverting input terminal coupled to the second output terminal and an inverting input terminal coupled to the first output terminal;

a voltage controlling unit configured to control a voltage of the non-inverting input terminal, so that the voltage is in a predetermined range; and when the voltage of the non-inverting input terminal is larger than a voltage of the inverting input terminal, the first comparator outputs an indication signal to denote that the detection node generates a zero current;

wherein the voltage controlling unit comprises a first NMOS transistor and a second comparator; a drain of the first NMOS transistor is coupled to the second output terminal, a source of the first NMOS transistor is grounded; the second comparator comprises a non-inverting input terminal, an inverting input terminal, and a second comparison output terminal, the non-inverting input terminal of the second comparator is coupled to the output terminal, the inverting input terminal of the second comparator is coupled to a reference voltage, and the second comparison output terminal is coupled to a gate of the NMOS transistor.

2. The zero current detector of claim 1, wherein the first comparator further comprises a first comparison output terminal to output the indication signal.

3. The zero current detector of claim 1, wherein the first and second transistors are NPN bipolar transistors which are configured in diode-connected fashion.

4. The zero current detector of claim 1, wherein the voltage of the non-inverting input terminal is controlled in the predetermined range by adjusting the reference voltage.

5. A DC-DC converter comprising:
a high-side switch coupled to a power source;
a low-side switch coupled between the high-side switch and ground, a detection node arranged between the high-side switch and the low-side switch;
a driver switching the high-side switch and the low-side switch on and off;
an inductor coupled between the detection node and a power output terminal;
a zero current detector coupled between the driver and the detection node to detect a reverse current of the inductor, comprising:
a bias current source;
a current mirror comprising: an input terminal coupled to the bias current source, a first output terminal, and a second output terminal;
a first transistor coupled to the first output terminal and grounded via a first resistor;
a second transistor coupled to the second output terminal and a detection node via a second resistor;
a first comparator comprising a non-inverting input terminal coupled to the second output terminal and an inverting input terminal coupled to the first output terminal;
a voltage controlling unit configured to control a voltage of the non-inverting input terminal, so that the voltage is in a predetermined range; and
when the voltage of the non-inverting input terminal is larger than a voltage of the inverting input terminal, the first comparator outputs an indication signal to denote that the detection node generates a zero current and the driver switches the low-side switch off;
wherein the voltage controlling unit comprises a first NMOS transistor and a second comparator; a drain of the first NMOS transistor is coupled to the second output terminal, a source of the first NMOS transistor is grounded; the second comparator comprises a non-inverting input terminal, an inverting input terminal, and a second comparison output terminal, the non-inverting input terminal of the second comparator is coupled to the output terminal, the inverting input terminal of the second comparator is coupled to a reference voltage, and the second comparison output terminal is coupled to a gate of the NMOS transistor.

6. The DC-DC converter of claim 5, wherein a detection value of the reverse current is changed by changing resistances of the first resistor and the second resistor.

7. The DC-DC converter of claim 5, wherein the first comparator further comprises a first comparison output terminal to output the indication signal.

8. The DC-DC converter of claim 7, wherein during a first period T1, the driver switches the high-side switch on and the low-side switch off, the inductor is charged and the load is supplied power via the power output terminal, the voltage of the detection node is positive, the voltage level of the inverting input terminal V− of the first comparator is lower than the voltage level of the non-inverting input terminal of the first comparator, the first comparison output terminal outputs a first control signal to the driver, the driver switches the high-side switch on and the low-side switch off under control of the first control signal.

9. The DC-DC converter of claim 8, wherein during a second period, the driver switches the high-side switch off and the low-side switch on, the inductor discharges to supply power to the load via the power output terminal, the voltage of the detection node is negative, the voltage level of the inverting input terminal of the first comparator is larger than the voltage level of the non-inverting input terminal of the first comparator, the first comparison output terminal outputs a second control signal to the driver, and the driver switches the high-side switch on and the low-side switch off under control of the second control signal.

10. The DC-DC converter of claim 9, wherein during a period, the detection node generates the zero current and the voltage of the detection node is zero simultaneously, the voltage level of the non-inverting input terminal of the first comparator is larger than the voltage level of the inverting input terminal of the first comparator, the first comparison output terminal outputs a third control signal to the driver, and the driver switches the high-side switch and the low-side switch off simultaneously to suppress the reverse current.

11. The DC-DC converter of claim 5, wherein when the DC-DC converter switches to discontinuous conduction mode (DCM) from continuous conduction mode (CCM) which is heavy load mode, the voltage of the detection node increases, the voltage level of the non-inverting input terminal of the first comparator increases.

12. The DC-DC converter of claim 11, wherein when the voltage level of the non-inverting input terminal of the first comparator is larger than the reference voltage, the second comparison output terminal outputs a control signal to turn on the first NMOS transistor, the first NMOS transistor clamps the voltage level of the non-inverting input terminal with the reference voltage, and the voltage of the non-inverting input terminal is limited in a predetermined range by adjusting the reference voltage.

13. The DC-DC converter of claim 12, wherein the voltage difference between the voltage of the non-inverting input terminal of the first comparator and the voltage of the inverting input terminal of the first comparator is controlled within a predetermined range to increase the responsivity of the first comparator.

14. The DC-DC converter of claim 5, wherein when the DC-DC converter works in CCM, and the voltage of the non-inverting input terminal is remained by adjusting the reference voltage.

* * * * *